United States Patent
Suga et al.

(10) Patent No.: US 7,100,279 B2
(45) Date of Patent: Sep. 5, 2006

(54) METHOD OF MOUNTING AN ELECTRONIC PART

(75) Inventors: Tadatomo Suga, 3-6-3, Higashinakano, Nakano-ku, Tokyo 164-0003 (JP); Toshihiro Itoh, Tokyo (JP); Hideto Nakazawa, Nagano (JP); Masatoshi Akagawa, Nagano (JP)

(73) Assignees: Tadatomo Suga, Tokyo (JP); Shinko Electric Industries Co., Ltd., Nagano (JP); Oki Electric Industry Co., Ltd., Tokyo (JP); Sanyo Electric Co., Ltd., Osaka (JP); Sharp Kabushiki Kaisha, Osaka (JP); Sony Corporation, Tokyo (JP); Kabushiki Kaisha Toshiba, Tokyo (JP); NEC Corporation, Tokyo (JP); Hitachi, Ltd., Tokyo (JP); Fujitsu Limited, Kawasaki (JP); Matsushita Electric Industrial Co., Ltd., Osaka (JP); Mitsubishi Denki Kabushiki Kaisha, Tokyo (JP); Rohm Co., LTD, Kyoto (JP)

( * ) Notice: Subject to any disclaimer, the term of this patent is extended or adjusted under 35 U.S.C. 154(b) by 204 days.

(21) Appl. No.: 10/828,210

(22) Filed: Apr. 21, 2004

(65) Prior Publication Data

US 2004/0211060 A1    Oct. 28, 2004

(30) Foreign Application Priority Data

Apr. 24, 2003    (JP) ............................. 2003-120408

(51) Int. Cl.
*H05K 3/34*    (2006.01)
*H01R 9/00*    (2006.01)
*B23K 31/02*   (2006.01)

(52) U.S. Cl. ............................ 29/840; 29/832; 29/843; 228/180.22; 228/205; 228/219; 228/221

(58) Field of Classification Search ................. 29/832, 29/840, 842, 843, DIG. 44; 228/205–207, 228/180.21, 180.22, 218–221
See application file for complete search history.

(56) References Cited

U.S. PATENT DOCUMENTS 3,500,532 A * 3/1970 Bray et al. .................. 228/116

(Continued)

FOREIGN PATENT DOCUMENTS

EP    0 352 020    1/1990

(Continued)

OTHER PUBLICATIONS

Suga, T. et al: "Surface Activated Bonding and its Application on Micro_Bonding at Room Temperature", Proceedings of the International Symposium on Microelectronics, Jun. 2, 1993, pp. 314-321, XP008032758.*

(Continued)

*Primary Examiner*—Peter Vo
*Assistant Examiner*—Livius Radu Cazan
(74) *Attorney, Agent, or Firm*—Staas & Halsey LLP

(57) ABSTRACT

A method of mounting an electronic part on a board, in which an electronic part and a mounting board on which the electronic part is to be mounted are placed in a vacuum or inert atmosphere, and the electronic part is mounted on the board by bringing the bonding members of the electronic part and the board into contact with each other at normal temperature to thereby mount the electronic part on the board, the method comprising forming the bonding members of at least one of the electronic part and the board out of a solder material, and bringing the bonding members of the electronic part and the board into contact with each other without preprocessing the bonding surfaces of the bonding members.

1 Claim, 5 Drawing Sheets

U.S. PATENT DOCUMENTS

| | | | | | |
|---|---|---|---|---|---|
| 4,245,768 | A | * | 1/1981 | Sater | 228/116 |
| 4,865,245 | A | * | 9/1989 | Schulte et al. | 228/116 |
| 5,090,609 | A | * | 2/1992 | Nakao et al. | 228/123.1 |
| 5,549,237 | A | * | 8/1996 | Oeftering et al. | 228/116 |
| 6,210,546 | B1 | * | 4/2001 | Coult et al. | 204/192.32 |
| 6,234,382 | B1 | * | 5/2001 | Rischke et al. | 228/245 |

FOREIGN PATENT DOCUMENTS

| | | |
|---|---|---|
| JP | 2-159047 | 6/1990 |
| JP | 2002-50861 A | 2/2002 |
| JP | 2002-64266 | 2/2002 |
| JP | 2002-373913 A | 12/2002 |

OTHER PUBLICATIONS

Suga et al., "Surface Activation Bonding—A New Approach to the Microbonding at Room Temperature", Jun. 1992, IMC 1992 Proceedings,Yokohama, pp. 104-109.*

Shigetou et al., "Room-Temperature Direct Bonding of CMP-Cu Film for Bumpless Interconnection", 0-7803-7038-4/01 IEEE, 2001 Electronic Components and Technology Conference.*

Suga et al., "Bump-less Interconnect for the Next Generation System Packaging", 0-7803-7038-4/01 IEEE, 2001 Electronic Components and Technology Conference.*

Takagi et al., "Room Temperature Silicon Wafer Direct Bonding In Vacuum By Ar Beam Irradiation", 0-7803-3744-1/97 IEEE, 1997, pp. 191-196.*

Suga et al., "A Novel Approach to Assembly and Interconnection for Micro Electro Mechanical Systems", 0-7803-2503-6 IEEE, 1995, pp. 413-418.*

Suga et al., "A New Approach to Cu-Cu Direct Bump Bonding", 1997 IEMT/IMC Proceedings, pp. 146-151.*

Matsuzawa et al., "Room-temperature Interconnection of Electroplated Au Microbump by Means of Surface Activated Bonding Method", 0-7803-7038-4/01 IEEE, 2001.*

Suga et al., "Surface Activated Bonding for New Flip CHip and Bumpless Interconnect Systems", 07803-74300-4/02 IEEE, 2002, 2002 Electronic Components and Technology Conference, pp. 105-111.*

* cited by examiner

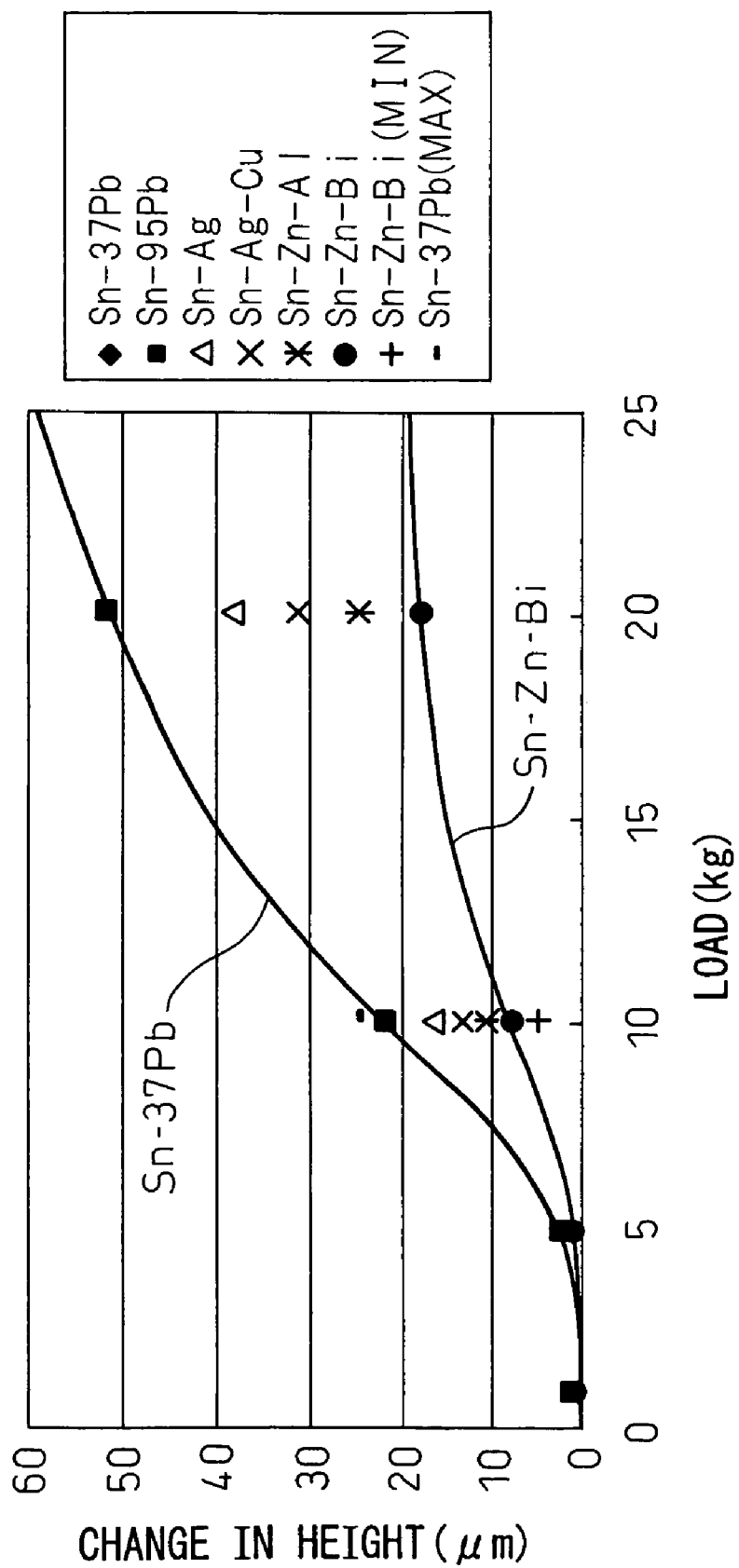

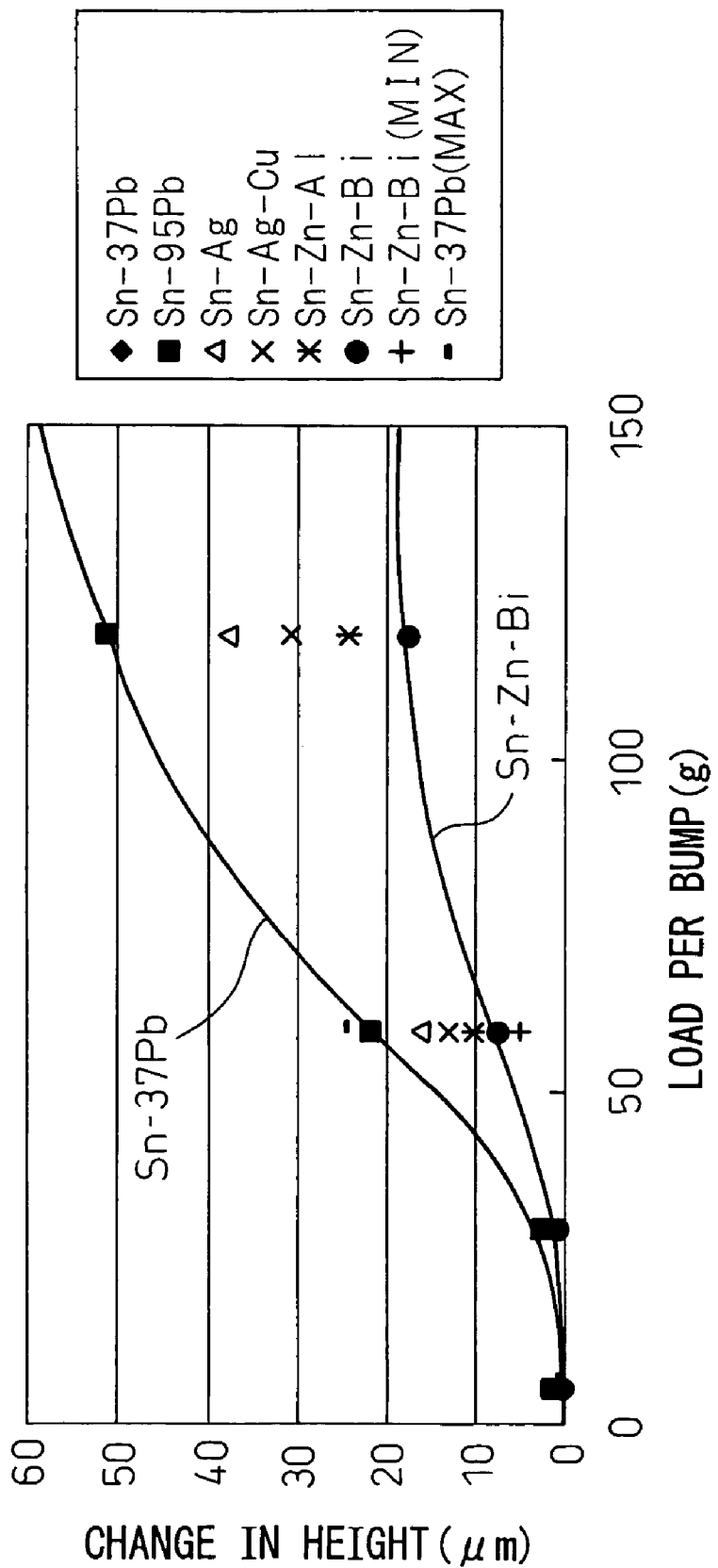

METHOD OF MOUNTING AN ELECTRONIC PART

BACKGROUND OF THE INVENTION

1. Field of the Invention

The present invention relates to a method of mounting an electronic part such as a semiconductor chip or a package.

2. Description of the Related Art

The bonding methods for mounting an electronic part, such as a semiconductor chip on a board, are currently divided, roughly, into a method using heat, such as solder reflow or resin cure, and an ultrasonic bonding method. Though different depending on the type of bumps used for bonding, both bonding methods use heat and load (hereinafter referred to "normal bonding"). Taking the effects on a chip into consideration, the conditions for an ideal bonding method include normal temperature, normal pressure and no load. Such a method, however, has not yet been realized.

An almost ideal bonding method has been proposed as a normal-temperature bonding method (hereinafter referred to as "normal-temperature bonding") using surface activation by Professor Tadatomo Suga, Research Center for Advanced Science and Technology, The University of Tokyo. According to this bonding method, the bonding surfaces are activated and thus can be bonded to each other simply by bringing them into contact with each other under a load. As a result, the bonding at normal temperature becomes possible under almost no load. Various inorganic and organic substances are under study as materials adapted to be bonded at normal temperature.

The normal-temperature bonding, however, requires preprocessing of the bonding surfaces, to make possible the bonding under a light load, by controlling the variations of roughness and height of the bonding surfaces to less than a predetermined level and thus increasing the chance of contact between the bonding surfaces. In an application of the normal-temperature bonding to the bonding of a semiconductor chip to a board, the bonding surfaces are currently preprocessed by CMP (chemical mechanical polishing) or electropolishing of the bumps on a chip, which are made of Au, Cu or the like material. This preprocessing increases both a burden on the chip, and the number of steps, as compared with the preprocessing for the normal bonding. The burden on the chip and the number of steps could both be reduced if the normal-temperature bonding is feasible even without using such severe preprocessing of the bonding surfaces.

Even in the case where the variations of bump roughness and height can be suppressed by the preprocessing of the bonding surfaces, the variations of the surface roughness and height of the board surface terminals still depend on the condition of the board to which the chip is to be bonded. Even bump deformation under a predetermined load, therefore, may not be able to absorb the variations of the gap between the bump bonding surface of the chip and the board surface, and the bonding may end in a failure. Applying an unnecessary heavy pressure to absorb the variations would damage the chip and the board. A similar problem may be posed also in the case where a package is mounted on a board.

The conventional method in which a semiconductor chip and a board are bonded to each other by normal-temperature bonding is described in Japanese Unexamined Patent Publications No. 2002-50861 and No. 2002-373913 (JP 2002-50861 A and JP 2002-373913 A). JP 2002-50861 A discloses a method of bonding an electronic part such as a semiconductor chip to a circuit-forming member such as a board by normal-temperature bonding using Au, Cu, Al, In or Sn as a material of a connector between the electronic part and the circuit-forming member. JP 2002-373913 A discloses a technique in which one electronic part having bonding sites provided with an indium layer and the other electronic part having connection terminals formed of a metal such as gold or copper at corresponding bonding sites are bonded to each other at the bonding sites at normal temperature in an electrolytic solution or a reducing solution.

SUMMARY OF THE INVENTION

An object of this invention is to provide a novel method of mounting an electronic part such as a semiconductor chip or a package on a board or substrate by normal-temperature bonding, without the need of severe preprocessing of the bonding surfaces of the electronic part and the mounting board, by CMP or electropolishing, to suppress the variations in the roughness and height of the bumps on the bonding surfaces of the electronic part and the board.

According to this invention, there is provided a method of mounting an electronic part on a board, in which an electronic part such as a semiconductor chip or a semiconductor package and a board on which the electronic part is to be mounted are placed in a vacuum or an inert atmosphere, and the electronic part is mounted on the board by bringing the bonding members of the electronic part and the board into contact with each other at normal temperature to thereby mount the electronic part on the board, the method comprising forming the bonding members of at least one of the electronic part and the board out of a solder material, and bringing the bonding members of the electronic part and the board into contact with each other without preprocessing the bonding surfaces of the bonding members.

An example of the solder material that can be used for the method according to the invention is a solder material that needs a vertical load of not more than 100 grams to change the height of a spherical bump having a diameter in the direction parallel to the electronic part body of 130 μm, by 8 μm. When a solder bump is used as the bonding member, the solder bump may be formed by the reflow of an electroplated solder material or may be obtained by directly positioning a solder ball in place.

BRIEF DESCRIPTION OF THE DRAWINGS

The above and other objects and advantages of the invention will be well understood and appreciated, by a person with ordinary skill in the art, from consideration of the following detailed description made by referring to the attached drawings, wherein:

FIG. 4 is a graph showing the relation between the load imposed on a dummy chip and the change in bump height;

FIG. 5 is a graph showing the relation between the load per bump and the change in bump height.

DETAILED DESCRIPTION OF THE INVENTION

Figure 1:
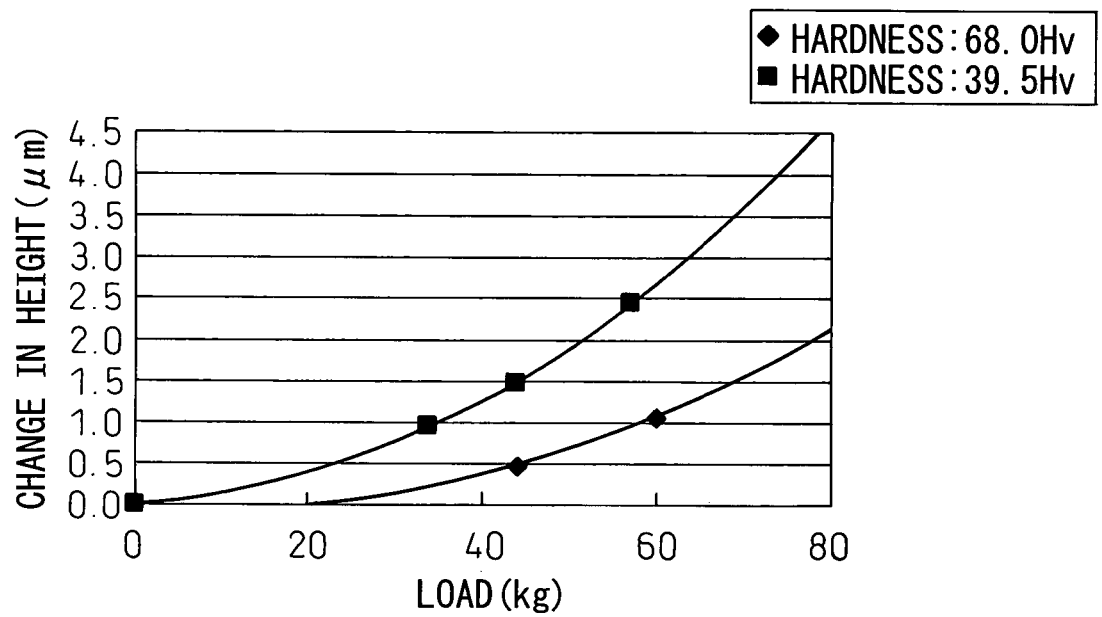
FIG. 1 is a graph plotting the change in bump height against the load imposed on a chip with the bump hardness as a variable.

In the normal-temperature bonding used in the method of mounting an electronic part according to this invention, the bonding surfaces of two materials activated by the removal of an oxide film are brought into contact with each other at normal temperature in a vacuum atmosphere (or an inert atmosphere) to thereby bond the two materials to each other. The normal-temperature bonding method has the following advantages:

(1) The bonding materials are not generally required to be heated in the bonding process, or if it is required, may be heated to a much lower temperature than the melting points of the bonding materials.

(2) Materials of different types can be bonded directly to each other.

(3) A part or parts to be bonded can comprise a low heat-resistance material.

The normal-temperature bonding involves the following four important factors: the atmosphere (vacuum or inert atmosphere) in which the bonding work is conducted, the activation of the bonding surfaces, the surface roughness of the bonding surfaces, and the variations in the height of bumps or pads of the bonding members. Of these factors, the present inventors have focused their attention on the surface roughness of the bonding surfaces and the height variations of the bonding members and conducted experiments of normal-temperature bonding between gold bonding members. In the experiments, a chip having a total of 169 gold bumps (each 100 μm in diameter and 15 μm in height) arranged thereon in 13 columns by 13 rows at a pitch of 300 μm is bonded to a flat silicon substrate with gold deposited by evaporation over the entire surface thereof. The gold bumps of the chip were subjected to a CMP process in a wafer stage, to be in conditions of a roughness of not larger than 10 nm and the bump height variation in each chip of not larger than 1 μm. After bonding at the conditions of a bonding weight of 207 g per bump, a bonding time of 30 seconds, an Ar ion radiation time of 10 minutes for activation of the bonding surfaces, and a vacuum of $5 \times 10^{-5}$ torr, a bonding shear strength was measured. As a result, values of 3.0 to 4.0 kg were obtained. Nevertheless, due to the bonding variations between the bonding sites, stable bonding for all the bumps could not be secured.

It was considered that, in the experiments, one-sided bonding due to the insufficient parallelism between the chip and the substrate and the gap remaining between the bonding members of the chip and the substrate were responsible for the lack of stable bonding. Accordingly, a new concept of "deformability" of the bumps was additionally studied. The deformability is the ability of a material to be deformed under an external force, and generally can be defined by a value such as an elongation, shrinkage or deflection of a material under an external force such as tension, compression, twisting or bending.

In the case of flip chip bonding of a semiconductor chip to a board through bumps by normal-temperature bonding, the bump deformability can be evaluated by an amount of crushing (the change in height) of a bump under a load. In the case of bonding of gold bumps, the bump deformability represents a factor for absorbing the causes of a bonding failure such as variation in surface roughness, variation in height of the bonding members of the board, variation in chip bump height, and one-sided contact between the bonding members of the chip and the board due to the insufficient parallelism of a bonding device. In the case where the degrees of these variations and the one-sided contact are large, the load must be increased to bond all the bumps. The increase in load, however, is not desirable as it means an increased mechanical pressure on the chip, the pads and the board terminals.

For the bumps having the same shape, the bonding under a smaller load is made possible by increasing the deformability. The bump deformability is related to the shape and hardness of the bumps in the following ways:

(1) The smaller the bump bonding area and the higher the bump, the larger the bump deformability.

(2) For the bumps of the same shape and material, the smaller the hardness of the bumps, the greater the deformability thereof.

The deformability of gold bumps was measured for two types of sample chips having gold bumps 100 μm in diameter and 15 μm in height, with the bump hardnesses being varied by annealing (bump hardness of 68.0 Hv and 39.5 Hv). These sample chips were formed on the same wafer. A graph plotting the change in height of the respective bumps against the load imposed on the chip is shown in FIG. 1.

Figure 2:
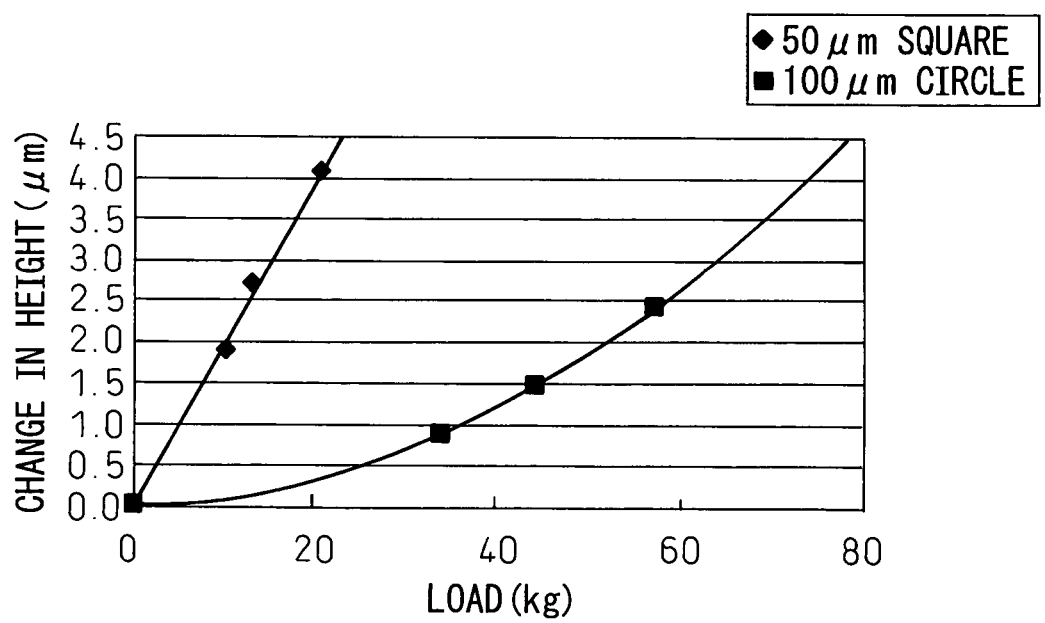
FIG. 2 is a graph plotting the change in bump height against the load imposed on a chip with the bump shape as a variable.

FIG. 2 shows the result of a similar test conducted on a chip provided with gold bumps having a square cross section of 50×50 μm, 15 μm in height and 40.1 Hv in hardness and a chip provided with gold bumps having a circular cross section 100 μm in diameter, 15 μm in height and 39.5 Hv in hardness.

From FIGS. 1 and 2, it can be seen that the change in bump height under a load changes with the hardness and geometry of the bump, and in order to secure a large change, a small harness or a small cross section is required and, with constant hardness and cross section, a large load is required.

Taking the deformability into account, experiments were conducted, with regard to a chip having gold bumps (100 μm in diameter and 15 μm in height) with a reduced hardness of 39.5 Hv, to bond it to a silicon substrate deposited with gold by evaporation. After bonding at the conditions of the bonding load of 207 g per bump or 355 g per bump, a bonding time of 30 seconds, an Ar ion radiation time of 10 minutes and a vacuum of $5 \times 10^{-5}$ torr, the bonding shear strength was measured. For the bonding load of 207 g per bump, values of 3.1 to 7.2 kg were obtained, while the chip was broken under the bonding load of 355 g per bump, thereby making the measurement impossible. The bonded bump rate per chip was 83% and 100% for the bonding load of 207 g per bump and 355 g per bump, respectively. For comparison, the bonded-bump rate of the gold bump of high hardness (68 Hv) was determined to be 35%.

Analysis of the condition of the bonding boundary of the low-hardness gold bump under the transmission electron microscope (TEM) shows no recrystallization of normal gold-gold bonding at a high temperature involving a heating process, and the boundary could be clearly identified. For the case of the bonding load of 355 g per bump, crystal lattice lines (111) of gold were visible at a magnification of 6,000,000, while no void or lattice distortion was observed, and it was confirmed that the crystal lattices were firmly bonded to each other.

By adding the new factor of deformability in this way, the possibility of gold-gold bonding at normal temperature was confirmed. As described above, however, the preprocessing (CMP or the like) of the bonding surfaces of the bump ends is required, at this moment, to make use of the advantage of the normal-temperature bonding method. Thus, the conditions which make possible the normal-temperature bonding without the preprocessing of the bonding surfaces of the bump ends were further sought for, and it was eventually found that such conditions can be satisfied by various solder materials.

As an example, an explanation is given about a case in which a chip having spherical bumps (130 μm in diameter in the direction parallel to the chip surface) obtained by reflowing columnar bumps of Sn-37Pb solder was bonded to a silicon substrate deposited with gold by evaporation without preprocessing the bonding surfaces of the solder bump ends. The bonding conditions were: a bonding load of 177.5 g per bump or 355 g per bump, a bonding time of 60 seconds, an Ar ion radiation time of 10 minutes and a vacuum of $1 \times 10^{-5}$ torr.

For both the bonding load of 177.5 g per bump and 355 g per bump, the bonding rate of the bumps to the gold-deposited silicon substrate was 100%. The shear strength of the bumps bonded was 11.1 to 11.3 kg for the bonding load of 177.5 g per bump, or more than the measurement limit of the measuring instrument for the bonding load of 355 g per bump. All cases of failure occurred within the solder bump during the shear strength measurement and no separation at the bonding boundary was observed. Observation of the bonding boundary under TEM showed the existence of a layer that appears to be a tin-gold alloy in the neighborhood of the boundary, while the bonding was free of voids or lattice deformation in the boundary and was satisfactory.

This indicates the possibility that a material, such as solder, having a very low hardness can exhibit the effects of normal-temperature bonding in practical applications.

A series of experiments conducted by the inventors showed that the minimum height change of the bumps required for normal-temperature bonding is 2 to 3 μm. Generally, the height variations of the bonding surfaces of the pads of a resin wiring board flip-chip bonded with a semiconductor chip is usually 4 to 5 μm. The height variations of the bonding surfaces of the pads is smaller when the wiring board is a silicon substrate. From this, it can be estimated that as long as the solder bump height change of 6 to 8 μm can be secured under a small load, a semiconductor chip can be generally bonded at normal temperature to all types of the wiring boards used for flip-chip bonding, without the need of preprocessing the solder bump bonding surfaces bonding. The inventors have found that these conditions are met by a solder material which needs a vertical load of not greater than 100 grams to change the height of a spherical bump, having a diameter in the direction parallel to a chip body of 130 μm, by 8 μm.

Figure 3:
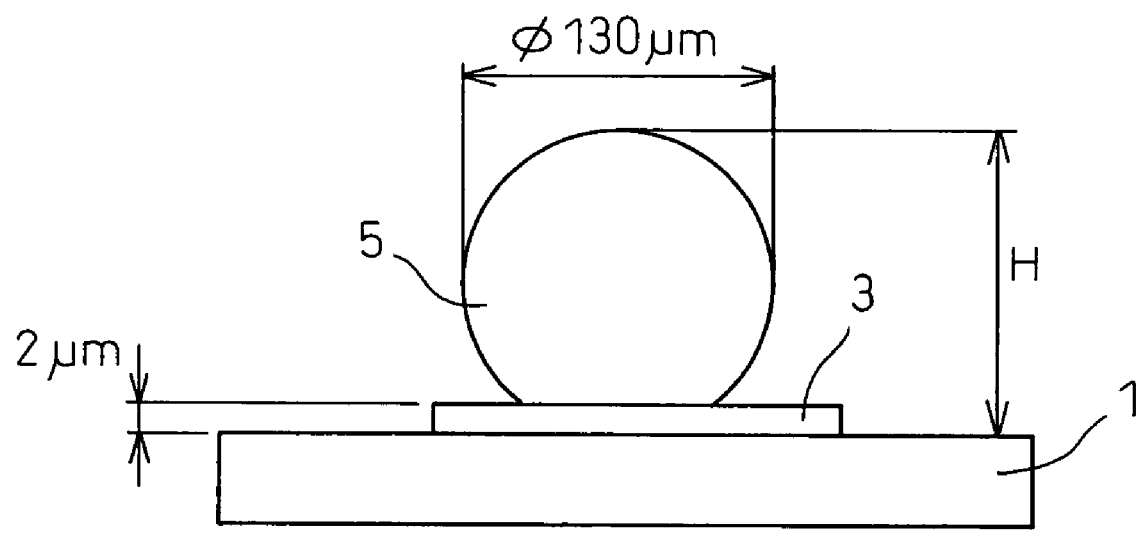
FIG. 3 is an illustration of a spherical bump formed on a dummy chip.

As schematically shown in FIG. 3, a dummy chip 1 having aluminum pads 3 were prepared, and on the pads 3, 169 spherical bumps 5 (obtained by reflowing columnar solder material) were formed per chip. The characteristics of the bumps were as follows:

| | |
|---|---|
| Solder composition: | Sn—37Pb |
| Hardness: | 9.1 Hv on average (7.8 to 11.0 Hv) |
| Diameter | 130 μm |
| Height | 102 μm on average (98 to 106 μm) |

The value of bump height described above was obtained by measuring a bump height of the bumped dummy chip placed on a flat board in a face-down fashion, using the measuring instrument Model NH-3 of Mitaka Kohki Co., Ltd, and subtracting the chip thickness from the resulting figure. As seen from FIG. 3, therefore, the bump height H includes the thickness of 2 μm of the pad 3.

In order to study the bump deformability, bumped dummy chips were placed in a face-down fashion on a flat board in a clean room, and were pressed under the loads of 1 kg, 5 kg, 10 kg and 20 kg, to thereby determine the change in bump height as a change in height from the board surface. The results shown in Table 1 were obtained assuming that the average bump height of 102 mm described above constitutes a reference bump height before deformation. As the average value (102 mm) was used as the reference bump height, the measured values under a light load were negative for the bumps having a larger height before deformation than the reference height.

TABLE 1

| | Change in Bump Height (μm) | | | |
|---|---|---|---|---|
| Load | Min. | Max. | Average | 3σ |
| 1 kg | −2.57 | 5.57 | 1.24 | 5.20 |
| 5 kg | −1.59 | 6.62 | 2.44 | 6.12 |
| 10 kg | 19.91 | 23.58 | 21.92 | 2.69 |

These measurements have led to the graph of FIG. 4 showing the relation between the load imposed on the dummy chip itself and the change in bump height, and the graph of FIG. 5 showing the relation between the load per bump and the change in bump height. FIGS. 4 and 5 show the measurements for the Sn-37Pb solder bumps, as well as the changes in bump height for the solder materials shown in Table 2 below, calculated from measurements on the assumption that the changes for the bumps having the same geometry are proportional to the hardnesses of the bump materials (Sn-37Pb and Sn-95Pb are plotted in superposed relation with each other due to their hardnesses close to each other). FIGS. 4 and 5 also show approximation curves for Sn-37Pb (solder material of smallest hardness) and Sn—Zn—Bi (solder material of largest hardness) by the least square method.

TABLE 2

| Solder Types and Hardnesses (Hv) | | | |
|---|---|---|---|
| Solder | Min. | Max. | Av. |
| Sn—37Pb | 7.8 | 11.0 | 9.1 |
| Sn—95Pb | 8.6 | 11.0 | 9.2 |
| Sn—3Ag—0.5Cu | | 15 (Company A) | |
| Sn—3.5Ag | 10.3 | 16.9 | 12.2 |
| Sn—7Zn—60 ppmAl | | 18.9 (Company B) | |
| Sn—8Zn—3Bi | | 26 (Company A) | |

It can be seen that when the above-mentioned conditions requiring the securement of the change in bump height of 6 to 8 μm for bonding a semiconductor chip having solder bumps to the board at normal temperature are applied to the case of FIG. 5, the load at which a spherical bump having a diameter in the direction parallel to the surface of a chip of 130 μm exhibit a vertical change in size of 8 μm may be no greater than 60 to 70 g. This result shows that the chip can be bonded at normal temperature to the board without preprocessing the solder bump bonding surfaces under the load of not greater than 60 g or not greater than 70 g per bump. Actually, the load per bump required for normal-temperature bonding is considered to be affected also by the surface conditions of the bumps or pads of the board. In the invention, therefore, the solder material making the normal-temperature bonding feasible without preprocessing the solder bump bonding surfaces is defined as a solder material, a spherical bump made of which, having a diameter in the direction parallel to a chip body of 130 μm, exhibits the change in height of 8 μm when a load of not greater than 100 g is vertically applied to the bump.

In fact, in the case where dummy chips similar to that described above having bumps formed of the respective types of solder listed in Table 2 were bonded at normal temperature to silicon substrates having gold-plated copper pads without preprocessing the bump bonding surfaces, a satisfactory bonding result could be obtained for all the bumps under the load of 10 kg (59 g per bump). It was also ascertained that dummy chips similar to those described above can be bonded at normal temperature to much more uneven PCB boards without preprocessing the bump bonding surfaces, at the same conditions. In the case of gold bumps, in contrast, the normal-temperature bonding to a silicon substrate was possible under the load of 355 g per bump, but the normal-temperature bonding to a PCB board could not be achieved for the insufficient change in the bump height (FIG. 1). Furthermore, even the bonding to the silicon board required the preprocessing of the bump bonding surfaces.

As known in the technical field of normal-temperature bonding, especially the normal-temperature bonding of a semiconductor chip, the technical concept of normal-temperature bonding generally covers the bonding by heating to a temperature lower than the melting point of a bonding material (in the case of gold bumps, for example, the bonding by heating to about 200° C. is known and is called also a normal-temperature bonding) as well as the bonding without heating the bonding material to an elevated temperature. The normal-temperature bonding in the invention also includes the bonding by heating solder bumps to a temperature lower than the melting point thereof. The bonding by heating the bump material to a temperature lower than the melting point thereof in the invention has an advantage that it facilitates the bonding in an inert atmosphere, such as nitrogen or argon, and not in a vacuum atmosphere, and it reduces the bonding load. The inventors have experimentally ascertained that a chip with solder bumps having the bonding surfaces not preprocessed can be bonded to a board heated to 100° C. in a nitrogen atmosphere.

Various embodiments of the invention will now be described with reference to FIGS. 6A to 6D.

Figure 6A:
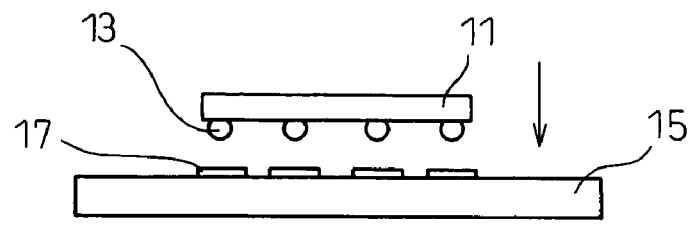
FIGS. 6A to 6D schematically illustrate various embodiments of the invention.

FIG. 6A illustrates an embodiment in which a semiconductor chip 11 (or a semiconductor package) having solder bumps 13 formed thereon is bonded at normal temperature to a wiring board 15 having pads 17 formed thereon without preprocessing the bonding surfaces of the bumps 13.

Figure 6B:
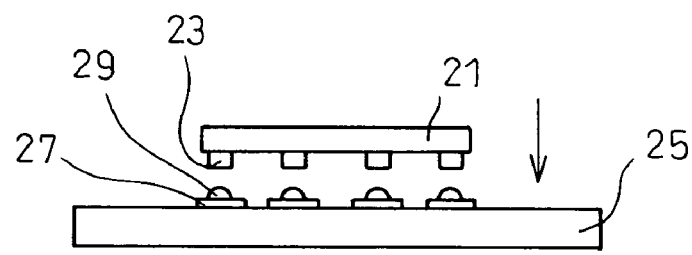

FIG. 6B illustrates an embodiment in which a semiconductor chip 21 (or a semiconductor package) having gold bumps 23 formed thereon is bonded at normal temperature to a wiring board 25 with solder bumps 29 formed on pads 27 without preprocessing the bonding surfaces of the bumps 23 and 29.

Figure 6C:
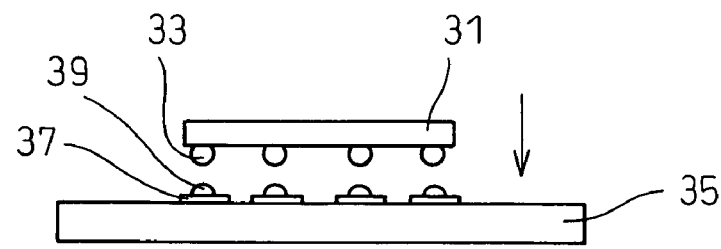

FIG. 6C illustrates an embodiment in which a semiconductor chip 31 (or a semiconductor package) having solder bumps 33 formed thereon is bonded at normal temperature to a wiring board 35 with solder bumps 39 formed on pads 37 without preprocessing the bonding surfaces of the bumps 33 and 39.

Figure 6D:
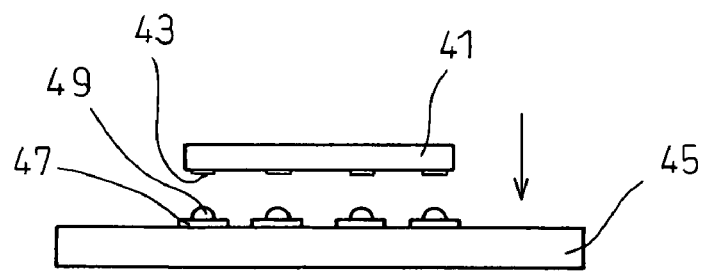

FIG. 6D illustrates an embodiment in which a semiconductor chip 41 (or a semiconductor package) having pads 43 formed thereon is bonded at normal temperature to a wiring board 45 with solder bumps 49 formed on pads 47 without preprocessing the bonding surfaces of the bumps 49.

It will thus be understood from the foregoing description that, according to the invention, using bonding members formed of a solder material having a sufficient deformability as the bonding members for at least one of an electronic part, such as a semiconductor chip or a package, and a mounting board, the electronic part can be mounted on the mounting board at normal temperature without preprocessing the bonding surfaces of the bonding members. Thus, the preprocessing of the bonding surfaces of the bonding members by such means as CMP or electropolishing, which is disadvantageous for the electronic part, is avoided, whereby the burden on the electronic part is reduced and the number of required processing steps can be reduced. Further, the normal-temperature bonding of an electronic part to an organic wiring board, which has hitherto been difficult for the normal-temperature bonding with gold bumps or the like, is made possible.

The invention claimed is:

1. A method, of mounting an electronic part on a board, in which an electronic part and a mounting board on which the electronic part is to be mounted are placed in a vacuum or inert atmosphere, and the electronic part is mounted on the board by bringing bonding members of the electronic part and the board into contact with each other at normal-temperature substantially below a melting point of a material from which the bonding members are made, to thereby mount the electronic part on the board, the method comprising:

forming the bonding members of at least one of the electronic part and the board out of a solder material, in a form of a bump placing the electronic part and the board in the vacuum or the inert atmosphere;

activating a surface of the bonding members so as to remove oxides from the surface;

bringing the bonding members of the electronic part and the board into contact with each other without preprocessing the bonding surfaces of the bonding members;

wherein said preprocessing comprises a process for planarization selected from the group consisting of:

CPM, and electropolishing against variations in a roughness or a height of bonding surfaces;

wherein said solder material is deformed during said bonding to absorb the variations in the roughness or the height of the bonding surfaces to be in close contact with the bonding surface; and wherein said solder material is a solder material that needs a vertical load of not greater than 100 grams to change the height of a spherical bump, having a diameter in a direction parallel to an electronic Part body of 130 μm by 8 μm.

* * * * *

UNITED STATES PATENT AND TRADEMARK OFFICE
CERTIFICATE OF CORRECTION

PATENT NO. : 7,100,279 B2
APPLICATION NO. : 10/828210
DATED : September 5, 2006
INVENTOR(S) : Tadatomo Suga et al.

Page 1 of 1

It is certified that error appears in the above-identified patent and that said Letters Patent is hereby corrected as shown below:

Title Page, Column 1 (Assignees), Line 13, change "LTD," to --LTD.,--.

Title Page 2, Column 2 (Other Publications), Line 15, change "CHip" to --Chip--.

Title Page 2, Column 2 (Other Publications), Line 17, before "Electronic", delete "2002".

Column 6, Line 7, change "102mm" to --102μm--.

Column 6, Line 9, change "(102mm)" to --(102μm)--.

Column 8, Line 32, change "temperature" to --temperature,--.

Column 8, Line 38, after "bump" insert --;--.

Column 8, Line 48, change "CPM," to --CMP,--.

Column 8, Line 59, change "Part" to --part--.

Signed and Sealed this

Ninth Day of October, 2007

JON W. DUDAS
*Director of the United States Patent and Trademark Office*